United States Patent [19]

Adam

[11] 4,395,686
[45] Jul. 26, 1983

[54] ATTENUATION OF HIGHER ORDER WIDTH MODES IN MAGNETOSTATIC WAVE DEVICES

[75] Inventor: John D. Adam, Murrysville, Pa.

[73] Assignee: Westinghouse Electric Corp., Pittsburgh, Pa.

[21] Appl. No.: 308,011

[22] Filed: Oct. 2, 1981

[51] Int. Cl.³ .......................... H01P 1/19; H03H 9/00
[52] U.S. Cl. .................................. 333/151; 333/147; 333/148
[58] Field of Search ............................... 333/150-155, 333/193-196, 147-148, 24.1, 141-142, 156, 160, 161; 310/313 R, 313 A, 313 B, 313 C, 313 D, 26; 331/107 A; 330/4.6

[56] References Cited

U.S. PATENT DOCUMENTS

| 4,028,639 | 6/1977 | Hagon et al. | 331/107 A |
| 4,199,737 | 4/1980 | Patterson et al. | 333/148 X |
| 4,314,214 | 2/1982 | Castera et al. | 333/148 X |

Primary Examiner—Marvin L. Nussbaum
Attorney, Agent, or Firm—R. M. Trepp

[57] ABSTRACT

A magnetostatic wave device is described incorporating a plurality of resistive strips spaced apart from one another and transverse to the propagation path of magnetostatic waves in a material such as a YIG film having a finite width for attenuating selected higher order modes of propagating magnetostatic waves.

17 Claims, 12 Drawing Figures

ATTENUATION OF HIGHER ORDER WIDTH MODES IN MAGNETOSTATIC WAVE DEVICES

GOVERNMENT CONTRACT

The Government has rights in this invention pursuant to Contract No. F33615-77-C-1068 awarded by the Defense Logistics Agency.

BACKGROUND OF THE INVENTION

1. Field of the Invention

This invention relates to magnetostatic wave devices and particularly to mode filters for suppressing higher order magnetostatic wave propagation modes.

2. Description of the Prior Art

Magnetostatic waves, which propagate in a supporting medium such as yttrium iron garnet (YIG) films, have potential applications in microwave delay lines and filters for use in radar, electrical countermeasure equipment and communication systems. Constant delay lines with bandwidths of 400 megahertz and delays of about 100 nanoseconds and linear dispersive "chirp" delay lines with bandwidths of about 1 gigahertz and differential delays of 200 nanoseconds have been demonstrated at 9 gigahertz. For example, a magnetostatic wave delay line which includes an adjustable dispersion characteristic is described in U.S. Pat. No. 3,935,550 which issued on Jan. 27, 1976 to John D. Adam, the inventor herein and Jeffrey H. Collins entitled "Group Delay Equalizer". In U.S. Pat. No. 3,935,550 a thin ferrimagnetic film such as yttrium iron garnet (YIG) is shown deposited on a non-magnetic substrate with an input transducer or coupler positioned at one end of the film for generating magnetostatic waves in the film in response to electrical signals at frequencies as high as 3 gigahertz. The generated magnetostatic wave propagates along the film in a direction transverse to the input transducer and is sensed by an output transducer positioned some distance from the input transducer along the YIG film. Several magnetic biasing arrangements are shown. A forward surface wave is generated by the input transducer if the H field is applied in the plane of the film but perpendicular to the direction of propagation. A forward volume wave is generated by the input transducer if the H field is normal to the plane of the film. A backward volume wave is formed by an input transducer when the H field is in the plane of the film in the direction of propagation of the magnetostatic wave. Typically a magnetostatic wave is generated by passing current through a wire or conductor placed adjacent to the YIG film. The magnetic field surrounding the wire induces the magnetostatic wave in the YIG film which then propagates in the YIG film depending on the magnitude and orientation of an external magnetic field resulting in a biasing H field in the film.

A more complex input transducer is described in U.S. Pat. No. 4,199,737 which issued on Apr. 22, 1980 to Ralph W. Patterson, Terence W. O'Keefe and John D. Adam, the inventor herein, entitled "Magnetostatic Wave Device". In U.S. Pat. No. 4,199,737 two sets of interdigitated fingers are connected to receive the same microwave input signal which is divided between the two sets. For example, FIG. 8 shows that each set has 5 fingers which are interdigitated with a second set of 5 fingers. FIG. 20 shows a set of 11 fingers interdigitated with a second set of 11 fingers wherein the lengths of the fingers are varied so that only some of the fingers are in interdigital relationship. The more complex input and output transducers permitted transducers to be made having predetermined spectral responses such as a narrow band response with low sidelobe levels and a flat peak response.

One of the problems still present with magnetostatic devices arises from the possibility of multi-mode propagation of the magnetostatic wave leading to attenuation and phase ripple on delay lines and undesired responses in bandpass filters.

A YIG film of finite width is effectively a magnetostatic waveguide and, in common with electromagnetic and acoustic waveguides, can support the usual desired lowest order mode plus higher order modes. With magnetostatic surface waves, only higher order "width" modes can exist but with magnetostatic volume waves both higher order "thickness" and "width" modes can exist. Higher order modes are launched, along with the lowest order mode, by the input transducer with the launching efficiency dependent upon the transducer geometry. Higher order modes of magnetostatic waves are also produced by scattering of the lowest order mode by defects in the YIG film. At the receiving transducer the highest order modes interfere with the lowest order mode, producing amplitude and phase ripple as well as increasing the overall insertion loss of the delay lines.

Higher order volume wave "thickness" modes generally have a delay which is more than twice as long as the lowest order mode and thus have higher insertion losses and consequently are less troublesome than the "width" modes. "Width" modes show longer delays than the lowest order mode at low frequencies, i.e., low wave numbers, but become degenerate with the lowest order mode at high frequencies. The width modes do not dissipate at the edges of the YIG film since no absorbing material is located there. It is understood that the width modes are traveling in the desired propagation direction with a variation in amplitude arising from interference between two waves propagating transverse to the desired propagation direction.

Electromagnetic waves, as compared to magnetostatic waves, have been known to have higher order modes of propagation which are propagating simultaneously in a waveguide. Higher order modes of electromagnetic waves have been attenuated by using mode filters which may for example consist of sheets of resistive material positioned in the waveguide. The use of mode filters in rectangular waveguides is described in a publication entitled "Mode Filters for Oversized Rectangular Waveguides" by Hans-Jurgen Butterweck appearing in IEEE Transactions on Microwave Theory and Techniques, Volume MTT-16, No. 5, May 1968, pp. 274–281. In FIG. 5 at page 278 a slotted waveguide is shown having slots in the upper and lower surface of the waveguide to interrupt currents traveling transverse on the upper and lower surface with resistive sidewalls for higher order mode attenuation. A second publication discussing mode filters is entitled "A Method of Calculating the Attenuation Constants of the Unwanted Modes in Mode Filters Using Resistive Sheets" by Sadakuni Shimada which appeared in the IEEE Transactions on Microwave Theory and Techniques, Volume MTT-14, pp. 159–161, 1966. In the publication, mode filters are provided by mounting resistive sheets in hollow waveguides so that they are always perpendicular to the electric field of the main mode. While these two publications are directed to attenuating selected modes of electromagnetic wave energy propagating in waveguides, it is the closest known art for providing mode filters and suppressing higher order modes of electromagnetic wave energy.

It is therefore desirable to provide a mode filter for suppressing higher order modes of magnetostatic waves in magnetostatic wave devices.

It is further desirable to provide a mode filter for suppressing of higher order width modes in magnetostatic waves traveling in a supporting medium by depositing conductive segments transverse to the direction of desired propagation.

It is further desirable to provide attenuation of higher order width modes of magnetostatic waves in a YIG film by depositing thin aluminum strips adjacent one another extending from edge to edge across the YIG film transverse to the direction of desired magnetostatic wave propagation.

SUMMARY OF THE INVENTION

In accordance with the present invention, a magnetostatic wave device operable with microwave signals and operable within a biasing magnetic field is described comprising material suitable for propagating magnetostatic waves, first and second transducers spaced apart for generating and receiving magnetostatic waves along a propagation path therebetween, and a plurality of resistive strips spaced apart from one another and positioned above and transverse to the propagation path of the magnetostatic waves for attenuating selected modes of propagating magnetostatic waves occurring due to the width of the magnetostatic wave material.

The invention further provides a mode filter for attenuating selected higher order modes in a magnetostatic wave device utilizing a suitable material for propagating magnetostatic waves along a path comprising a plurality of resistive strips spaced apart from one another and positioned transverse to the path whereby selected modes of propagating magnetostatic waves which occur due to the finite dimensions of the material are attenuated by magnetic coupling to the resistive strips which induce currents in the resistive strips which are dissipated by the ohmic resistance of the material.

DESCRIPTION OF THE PREFERRED EMBODIMENT

Figure 1:
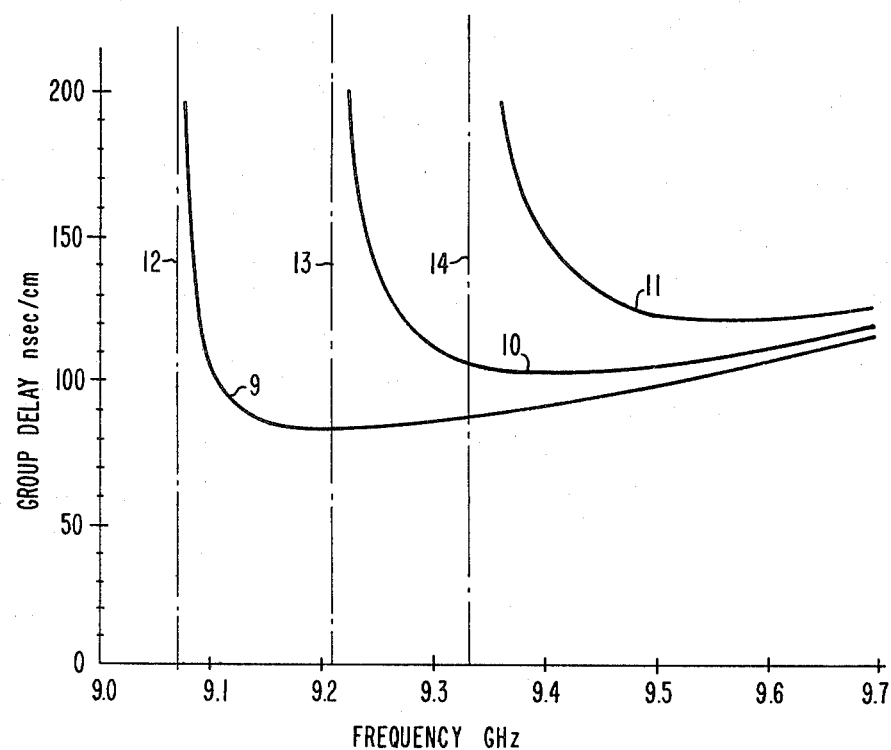
FIG. 1 is a graph showing group delay versus frequency for a number of propagating modes of magnetostatic waves.

Referring now to the drawing, FIG. 1 shows a calculated plot of the delay of magnetostatic waves as a function of frequency for forward volume waves. The calculations were made for a YIG film 18.5 micrometers thick and 1 millimeter wide, deposited on a gadolinium gallium garnet (GGG) substrate.

In FIG. 1, the ordinate represents group delay in nanoseconds per centimeter and the abscissa represents frequency in gigahertz. Curve 9 shows the group delay versus frequency for the case for the mode where n equals 1. Curve 10 shows the group delay versus frequency for the higher order mode n=3. Curve 11 corresponds to the group delay versus frequency for the higher order mode n=5. Reference lines 12, 13 and 14 show the lower limit of frequency for curves 9, 10 and 11 respectively when the group delay approaches infinity. This corresponds to the case where wave number K=0.

Figure 2:
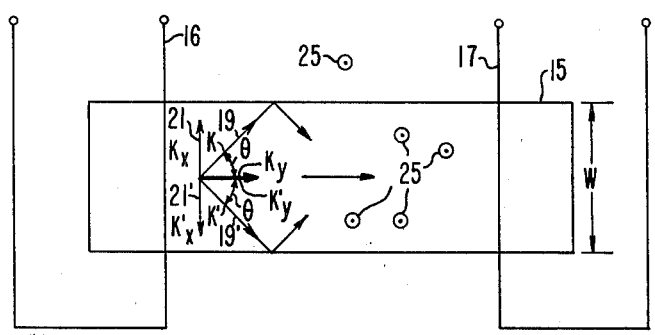
FIG. 2 is a top view of a YIG film with arrows depicting various propagating modes.

Referring to FIG. 2, the top view of film 15 is shown which functions to support a magnetostatic wave having a uniform width W. Material suitable for supporting a magnetostatic wave may be, for example, YIG, lithium ferrite or other ferrite materials. A transducer 16 injects magnetostatic waves into YIG film 15 which propagates in the direction shown by arrow 18. A transducer 17 converts some of the energy from the magnetostatic wave back into an electrical signal which appears at the ends of transducer 17 which may for example be a wire. Transducer 16 may for example be a wire; current passing through the wire induces magnetostatic waves to form in YIG film 15. YIG film 15 is biased by a magnetic field normal to the plane of the film shown by arrows 25. If the YIG film was infinite in extent the propagating wave number is K and corresponds to the zero order mode of propagation (n=0). This mode is a plane wave with a uniform amplitude transverse to the propagation direction. However because the radio frequency (rf) magnetization ($4\pi$m) is "pinned" or goes to zero at the edges of the YIG strip the zero order mode cannot exist. The characteristics of waves in the YIG strip can be considered as arising from the addition of two plane waves 19 and 19' with wave number K propagating at an angle $\theta$ to arrow 18 of the YIG film 15. Both plane waves have components of wave number $K_y$ along arrow 18 of YIG film 15 and $K_x$ transverse to arrow 18 of the film 15. K, $K_x$ and $K_y$ are related by $$K = \sqrt{K_x^2 + K_y^2} . \tag{1}$$

So that the wave number $K_y$ of the wave propagating along the YIG strip 15 is $$K_y = \sqrt{K^2 - K_x^2} . \tag{2}$$

Because the rf magnetization is zero at the edges of the YIG film, then $$K_x = n\pi/W \tag{3}$$

The higher order modes then arise from equation (3) since m is an integer 1, 2, 3 etc. and W is the width of the YIG film 15.

Figure 3:
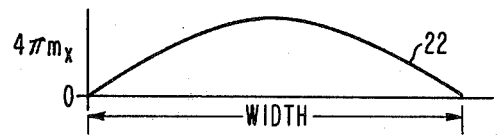
FIGS. 3-5 are graphs showing the rf magnetization $4\pi m_x$ across the width of a YIG film for modes n=1, 3, 5.

FIG. 3 shows the rf magnetization $4\pi m_x$ variation across the width of YIG film 15 of FIG. 2 wherein the propagation mode is n=1. Using equation (3), $K_x=\pi/W$. In FIG. 3, curve 22 resembles a sine curve from 0 to $\pi$ as it traverses the width of the YIG film 5 from one side to the other.

Figure 4:
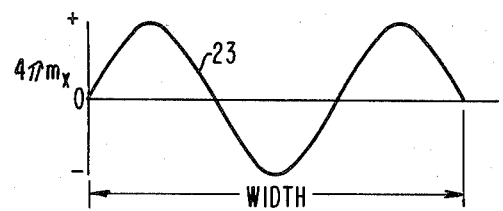

FIG. 4 shows the rf magnetization $4\pi m_x$ variation across the width of YIG film 15 where n=3. Using equation (3), $K_x=3\pi/W$. In FIG. 3, curve 23 resembles a sine curve from 0 to $3\pi$ as it traverses the width of the YIG film from one side to the other.

Figure 5:
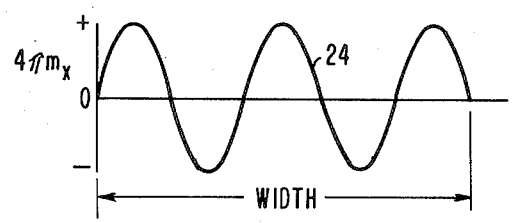

FIG. 5 shows the rf magnetization $4\pi m_x$ variation across the width of YIG film 15 where n=5. Using equation (3), $K_x=5\pi/W$. In FIG. 5 curve 24 resembles a sine curve from 0 to $5\pi$ as it traverses the width of the YIG film from one side to the other. In FIGS. 3-5 the ordinate represents $4\pi m_x$ or rf magnetization and the abscissa represents width where 0 is on one side of the YIG film and W is on the other side of the YIG film.

While higher order even modes such as 2, 4 and 6 have not been shown, the rf magnetization for the n=2 mode for example would vary across the width of the YIG film by a curve which resembles the sine function going from 0 to $2\pi$. The even modes do not normally occur with a simple wire transducer because the simple wire produces the magnetic field, inducing the magnetostatic wave, which is symmetrical about the axis of the YIG strip. Even modes can be induced into a magnetostatic wave by providing a transducer where the magnetic field inducing the magnetostatic wave is asymmetric about the axis of the YIG film.

Figure 6:
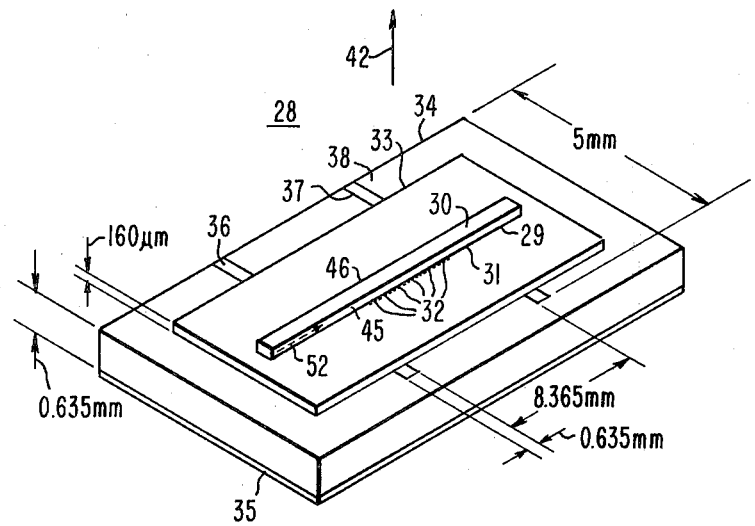
FIG. 6 is one embodiment of the invention.

FIG. 6 shows one embodiment of the invention such as a delay line 28. In FIG. 6 material 29 which is suitable for propagating magnetostatic waves such as yttrium iron garnet (YIG) is formed on a supporting substrate 30 such as gadolinium gallium garnet which is shown in more detail in FIGS. 7 and 8. The YIG film material 29 was grown by liquid phase epitaxy on a gadolinium gallium garnet substrate 30 shown in FIG. 6 and was sawed into a one millimeter wide strip. Material 29 has an upper surface 31. Upon upper surface 31 is deposited a plurality of resistive strips 32 which are spaced apart side by side and oriented in the width direction shown by W which is also transverse to the desired propagation path of magnetostatic waves shown by arrow 52. The plurality of resistive strips 32 is shown in more detail in FIGS. 7 and 8.

As shown in FIG. 6, the upper surface 31 of material 29 is positioned face down on a glass slide 33 which functions as a spacer. The glass slide 33 may for example be 160 micrometers thick. The glass slide in turn is placed over an alumina substrate 34. Alumina substrate 34 has a metallization 35 on its lower surface which acts as a ground plane. Two spaced apart metallizations 36 and 37 which are shown parallel to one another form input and output transducers for delay line 28. Metallizations 36 and 37 may for example be gold and have a width of 0.635 millimeters and a length of 5 millimeters. The spacing between metallizations 36 and 37 on upper surface 38 of alumina substrate 34 may be for example 8.365 millimeters. The thickness of substrate 34 is 0.635 millimeters. The geometry of the transducers 36 and 37 in combination with ground plane 35 provides a transducer with a narrow bandpass filter response. The combination of the wide transducer and the spacing of transducers 36 and 37 from material 29 (160 micrometers) results in only low wave number magnetostatic waves being efficiently generated.

Material 29 is subjected to a magnetic bias field orthogonal to the plane of material 29 shown by arrow 42. A suitable magnetic bias of 4880 oersteds was provided for the 18.5 micrometer thick material 29 which may be a YIG film.

Figure 7:
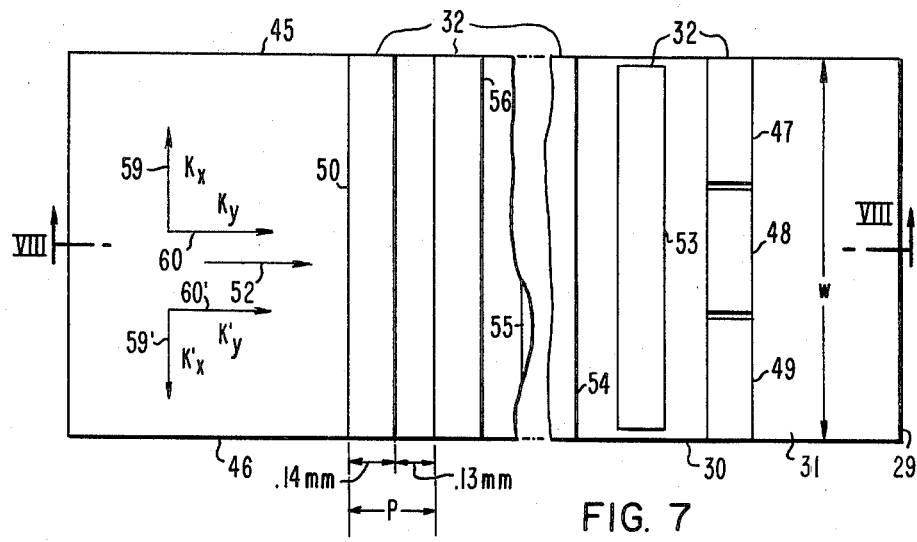
FIG. 7 is a more detailed view of the invention.

FIG. 7 is a top view looking on the upper surface 31 of material 29 supported by substrate 30. In FIG. 7 resistive strips 32 are shown more clearly each having a width of 0.14 millimeters and spaced apart from one another by 0.13 millimeters. Resistive strips 32 may extend across the width W of material 29 from edge 45 to edge 46. Resistive strips 32 may be continuous from edge 45 to edge 46 or they may be broken up into colinear segments 47, 48 and 49. The length of the segments 47, 48 and 49 in FIG. 7 are equal and are approximately one-third the width W of material 29 to provide high attenuation for higher order modes with $n \geq 3$. Other resistive strips such as strip 50 which extends the entire width from edge 45 to edge 46 of material 29 provides high attenuation for higher order modes n>1 and above. The material forming resistive strips 32 may for example be aluminum having a thickness of 364 Angstroms to provide a predetermined resistivity which may be expressed as ohms per square. In this example the resistivity was approximately 1$\Omega$/square. Resistive strips 32 may for example be made from any material exhibiting resistance; such as gallium arsenide, silicon, gold, nickel, chromium or alloys thereof. Miniature lumped resistors may also be used in combination with conducting or resistive strips to provide the resistance.

Figure 8:
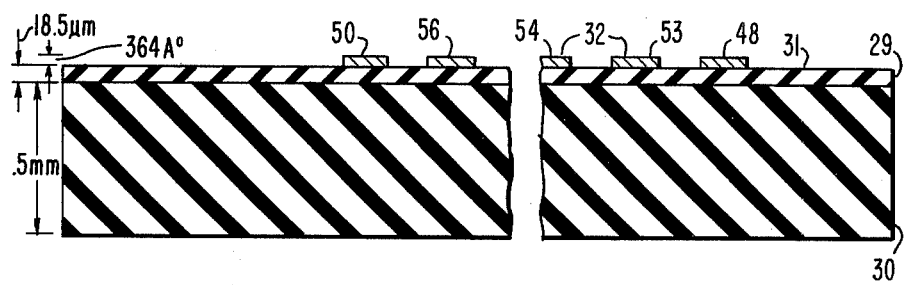
FIG. 8 is a cross-section view along the lines VIII—VIII of FIG. 7.

FIG. 8 shows a cross section view along VIII—VIII of FIG. 7 showing in more detail the structure of resistive strips 32. Resistive strips 32 may form a pattern or grating on material 29 such as 18 resistive strips 32 extending from edge 45 to edge 46 which are evenly spaced longitudinally. Arrow 52 in FIG. 7 shows the direction of propagation of a magnetostatic wave which would be induced in material 29 by transducer 36 when the material is positioned over transducer 36. The magnetostatic wave in material 29 would be a wavefront extending from edge 45 to edge 46 across the entire width of material 29.

Resistive strips 32 provide attenuation to higher order modes of a magnetostatic wave due to the induced currents in resistive strips 32. The higher order modes may be selectively attenuated by selecting the length of the resistive strips to correspond to the particular mode to be attenuated. The resistive strips 32 or grating can thus provide a mode filter. It is understood that it is not necessary for resistive strips 32 to continue to the edges 45 and 46 shown by resistive strip 53 of the material 29 but if the resistive strips are not continued to the edge then reduced attenuation may occur.

Resistive strips 32 are placed transverse to the propagating direction (shown by arrow 52) of the magnetostatic waves or in the $K_x$ direction shown by arrows 59 or width direction. Attenuation may occur in the direction of propagation, $K_y$ direction shown by arrow 60, if the metal strips or resistive strips 32 extend very long in the $K_y$ direction. The effective resistivity in the $K_y$ direction is infinite if the dimension P as shown in FIG. 7 is much less than $2\pi/K_y$. As the width of the metal strips 32 or the length of the resistive strips in the $K_y$ direction increase, the attenuation of the magnetostatic wave component in the $K_y$ direction will increase rapidly. By keeping the length of the metal paths in the direction of propagation short, then the path for induced currents will likewise be short and the attenuation of the magnetostatic wave component in the $K_y$ direction will be small. For example, a deposition of resistive strip in the form of a square having equal sides will result in attenuation of higher order modes of magnetostatic waves for components in both the direction of propagation $K_y$ and transverse to the direction of propagation $K_x$. The grating or pattern formed by resistive strips 32 is therefore selected to establish a finite resistivity in a direction transverse to the direction of propagation while providing high resistivity or impedance to currents in the direction of propagation $K_y$ resulting in low attenuation of magnetostatic wave components in the $K_y$ direction.

Figure 9:
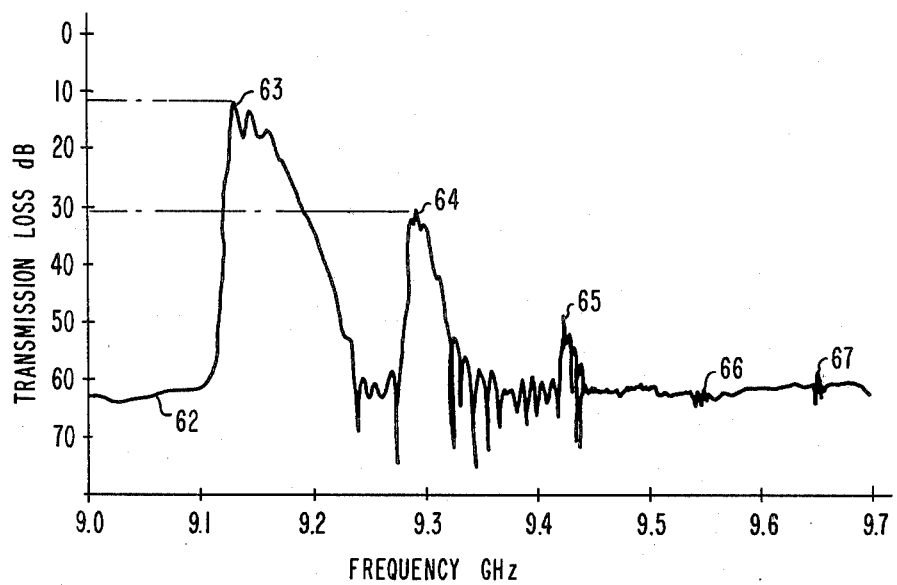
FIG. 9 is a graph showing the transmission loss as a function of frequency of the embodiment of FIG. 6 without the resistive strips.

FIG. 9 is a graph showing the transmission loss as a function of frequency for the embodiment of FIG. 6 without resistive strips 32. Transmission loss due to the higher order modes $K_x$ (see equation (3)) with n up to 9 can be clearly seen on curve 62 above the desired bandpass response of the mode n=1 at point 63 on curve 62. In particular, the higher order mode n=3 at point 64 on curve 62 is less than 20 db below the n=1 mode at point 63. In FIG. 9 the ordinate represents transmission loss in decibels and the abscissa represents frequency in gigahertz. Points 63 through 67 on curve 62 represent the minimum transmission loss where n=1, 3, 5, 7 and 9 respectively.

Figure 10:
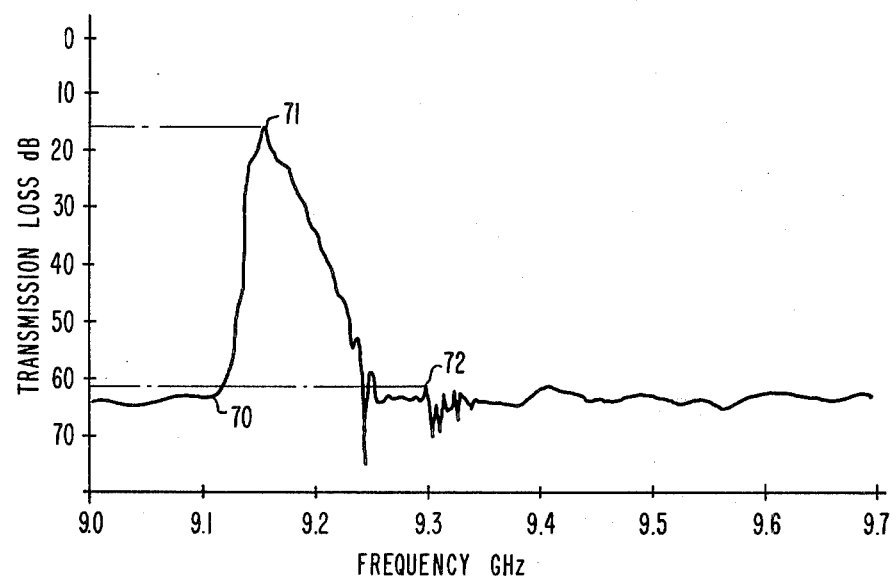
FIG. 10 is a graph showing the transmission loss as a function of frequency of the embodiment of FIG. 6 which includes the resistive strips.

FIG. 10 is a graph showing the transmission loss as a function of frequency for the embodiment of FIG. 6 which contains eighteen resistive strips 32 extending from edge 45 to edge 46. In FIG. 10 the ordinate represents transmission loss in decibels and the abscissa represents frequency in gigahertz. FIG. 10 shows a graph of transmission loss as a function of frequency under the same conditions as curve 62 in FIG. 9 was made except for an array of 18 aluminum strips each extending across material 29 from edge 46 to edge 45 having a width of 0.14 millimeter, spaced apart by 0.13 millimeter and a thickness of 364 Angstroms. Curve 70 shows the transmission loss due to the higher order mode n=3 at point 72 while point 71 shows the minimum transmission loss due to the higher order mode n=1. The transmission loss for the higher order mode n=3 appears to be 34 db below the n=1 bandpass response shown at point 1. Comparing curve 70 of FIG. 10 to curve 62 of FIG. 9 shows that the transmission loss caused by resistive strips 32 is greater than 60 decibels at frequencies above 9.26 gigahertz. Resistive strips 32 act as a mode filter with respect to higher order modes where n=3, 5, 7 and 9.

Figure 11:
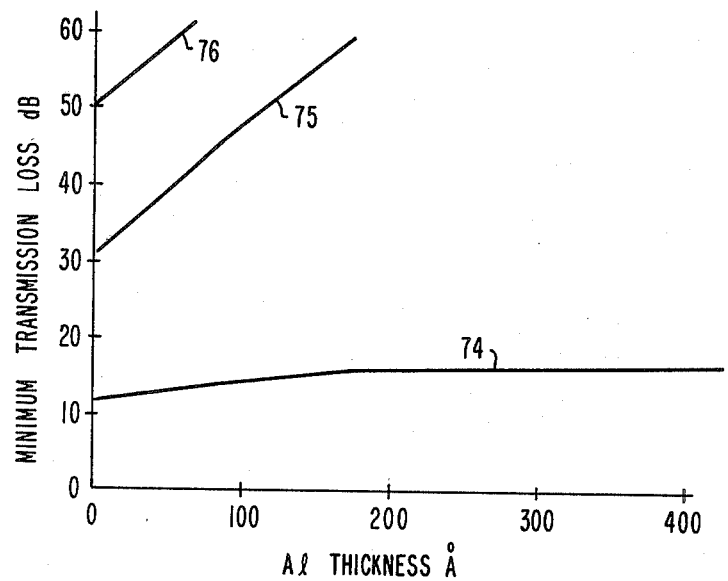
FIG. 11 is a graph showing minimum transmission loss versus the thickness of the resistive strips.

FIG. 11 is a graph showing minimum transmission loss or attenuation versus the thickness of resistive strips 32 in the embodiment of FIG. 6. In FIG. 11 the ordinate represents minimum transmission loss in decibels and the abscissa represents thickness of aluminum in Angstroms. Curve 74 shows the minimum transmission loss for the higher order mode where n=1. Curve 75 represents the minimum transmission loss for the higher order mode where n=3. Curve 76 represents the minimum transmission loss for the higher order mode where n=5. It is evident that the attenuation of the higher order modes increase rapidly with aluminum thickness but that the attenuation of the lowest order n=1 mode increase only by 4 db over the range measured. As the thickness of the aluminum strips increases, the resistivity decreases allowing induced currents to flow which are in turn dissipated by the resistance of the aluminum.

Figure 12:
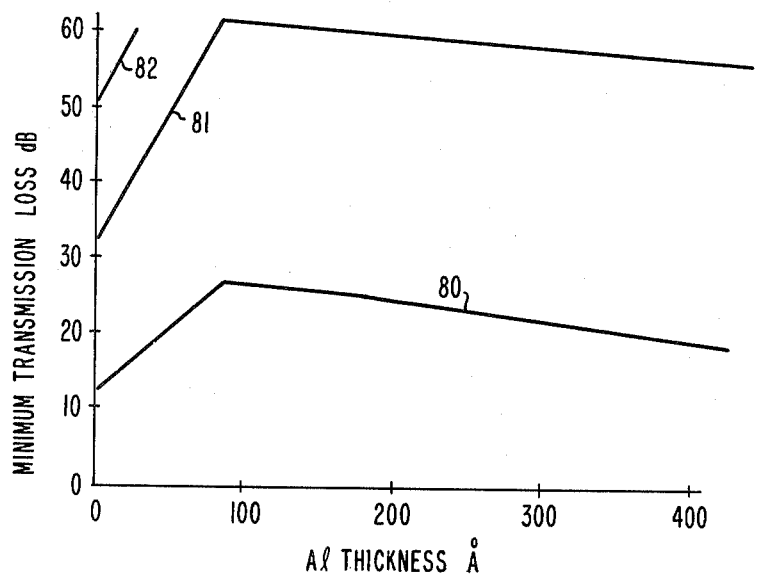
FIG. 12 is a graph showing minimum transmission loss versus the thickness of a resistive layer.

FIG. 12 is a graph showing minimum transmission loss or attenuation versus the thickness of an aluminum layer in Angstroms. In FIG. 12 the ordinate represents minimum transmission loss or attenuation loss in decibels and the abscissa represents aluminum thickness in Angstroms. Where FIG. 11 used a pattern of eighteen resistive strips 32, each 0.14 millimeter wide, 1 millimeter long in the $K_x$ direction, and separated by 0.13 millimeter, FIG. 12 used a pattern of a continuous sheet of aluminum 2.52 millimeters wide and 1 millimeter long in the $K_x$ direction which is equivalent to the pattern used in FIG. 11 except that the spaces in between the eighteen resistive strips 32 were reduced to zero. Curves 80, 81 and 82 in FIG. 12 show the minimum transmission loss for the higher order width modes n=1, 3 and 5, respectively. Curve 80 in FIG. 12 compared to curve 74 in FIG. 11 shows that the n=1 mode experiences a significant increase in attenuation when the pattern is a sheet of material in place of strips 32. In FIG. 12 the greatest difference in attenuation between the higher order mode n=1 and n=3 is 36 db at 364 Angstroms thickness of aluminum. The greatest difference in attenuation between the n=1 and n=3 modes for resistive strips is shown in FIG. 11 to be about 43 db for an aluminum thickness of about 180 Angstroms. The difference in attenuation increases beyond 44 db for thicknesses above 180 Angstroms.

The curves in FIGS. 9-12 confirm that the grating or plurality of resistive strips 32 produces a preferential loss for the higher order modes n=3 and above and that this technique can be used to "clean-up" the responses of magnetostatic wave filters and/or delay lines and allow transducers to be designed to synthesize desired frequency response characteristics. By using a plurality of resistive strips 32, a significant reduction in amplitude and phase ripple due to higher order width modes in filters and delay lines may be obtained.

A magnetostatic wave device operable with microwave signals and operable within a biasing magnetic field has been described comprising materials suitable for propagating magnetostatic waves such as YIG material on a GGG substrate, the material having a finite width transverse to the propagation path of magnetostatic waves, first and second transducers spaced apart from one another and in association with the material for generating and receiving magnetostatic waves along the propagation path, and a plurality of resistive strips spaced apart from one another and transverse to the propagation path for attenuating selected higher order modes of propagating magnetostatic waves occurring due to the finite width of the material.

Further, a mode filter for attenuating selected higher order modes in a magnetostatic wave device utilizing a suitable material for propagating magnetostatic waves along a path has been described comprising a plurality of resistive strips spaced apart from one another and positioned transverse to the path.

I claim:

1. A magnetostatic wave device operable with microwave signals and operable within a biasing magnetic field, comprising:
material suitable for propagating magnetostatic waves in a first direction and having a finite width transverse to said first direction;
a first and second transducer located in spaced apart relationship in association with said material for generating and receiving magnetostatic waves along a propagation path therebetween in said first direction; and a plurality of resistive strips spaced apart from one another and positioned above said material and transverse to said propagation path for attenuating selected modes of propagating magnetostatic waves occurring due to said finite width of said material.

2. A mode filter for attenuating selected higher order modes in a magnetostatic wave device utilizing a suitable material for propagating magnetostatic waves along a path comprising:

a plurality of resistive strips spaced apart from one another and positioned on said material transverse to said path.

3. The magnetostatic wave device of claim 1 or 2 wherein said plurality of resistive strips include aluminum having a thickness in the range from 10 to 400 Angstroms.

4. The magnetostatic wave device of claim 1 or 2 wherein said plurality of resistive strips are positioned parallel to one another.

5. The magnetostatic wave device of claim 1 or 2 wherein said resistive strips are spaced apart from one another by a predetermined distance.

6. The magnetostatic wave device of claim 1 or 2 wherein said resistive strips are rectangular in shape having a predetermined length.

7. The magnetostatic wave device of claim 1 or 2 wherein said resistive strips are rectangular in shape having a predetermined width.

8. The magnetostatic wave device of claim 1 or 2 wherein at least one of said resistive strips has a plurality of segments colinear to one another.

9. The magnetostatic wave device of claim 1 or 2 wherein at least one of said resistive strips has a plurality of segments of equal length colinear to one another.

10. The magnetostatic wave device of claim 1 or 2 wherein said plurality of resistive strips extend across the entire width of said material.

11. The magnetostatic wave device of claim 1 or 2 wherein said plurality of resistive strips each have a resistivity of at least 1 ohm/square centimeter.

12. The magnetostatic wave device of claim 1 or 2 wherein said material is yttrium iron garnet.

13. The magnetostatic wave device of claim 1 or 2 wherein said plurality of resistive strips include chromium.

14. Apparatus for delaying microwave signals comprising:

a substrate of gadolinium gallium garnet having a first surface;

a film of yttrium iron garnet deposited on said first surface;

first means for generating magnetostatic waves in said film in response to said microwave signals;

second means for converting magnetostatic waves propagating in said film to microwave signals;

and, third means for attenuating magnetostatic waves of higher order modes traveling transverse to the direction between said first and second means.

15. The apparatus of claim 14 wherein said third means for attenuating include conductive electrodes spaced apart from one another and positioned on said film transverse to the direction between said first and second means.

16. The apparatus of claim 15 wherein said conductive electrodes have a first and second end and have a predetermined resistance from its first to second end.

17. The apparatus of claim 14 wherein said third means for attenuating include a transverse grating formed longitudinally on the surface of said film intermediate said first and second means.

* * * * *